(12) United States Patent
Park et al.

(10) Patent No.: US 11,287,480 B2
(45) Date of Patent: Mar. 29, 2022

(54) METHOD AND DEVICE FOR ESTIMATING STATE OF CHARGE OF BATTERY

(71) Applicants: Hyundai Motor Company, Seoul (KR); Kia Motors Corporation, Seoul (KR)

(72) Inventors: Seungwon Park, Hwaseong-si (KR); Sunho Choi, Hwaseong-si (KR); Sung Tae Kim, Seoul (KR); Yong Hyun Kim, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 23 days.

(21) Appl. No.: 17/083,523

(22) Filed: Oct. 29, 2020

(65) Prior Publication Data
US 2021/0181262 A1  Jun. 17, 2021

(30) Foreign Application Priority Data
Dec. 13, 2019 (KR) .......................... 10-2019-0166762

(51) Int. Cl.
G01R 31/3835 (2019.01)
G01R 31/389 (2019.01)
G01K 3/00 (2006.01)
B60L 58/12 (2019.01)

(52) U.S. Cl.
CPC .......... *G01R 31/3835* (2019.01); *B60L 58/12* (2019.02); *G01K 3/005* (2013.01); *G01R 31/389* (2019.01)

(58) Field of Classification Search
None
See application file for complete search history.

(56) References Cited

U.S. PATENT DOCUMENTS

2007/0139013 A1* 6/2007 Seo ........................ B60W 20/13
320/130

* cited by examiner

*Primary Examiner* — Jas A Sanghera
(74) *Attorney, Agent, or Firm* — Morgan, Lewis & Bockius LLP

(57) ABSTRACT

A method for estimating a state of charge (SOC) value of a battery may include determining, by a controller, whether an entry condition for estimating the SOC value of the battery is satisfied based on state data of the battery; generating, by the controller, an initial SOC value of the battery using an internal resistance value of the battery when the state data satisfies the entry condition; generating, by the controller, a first storage capacity of the battery to generate using the initial SOC value; generating, by the controller, a second storage capacity of the battery using the first storage capacity and a charging efficiency of the battery; and estimating, by the controller, the SOC value of the battery using the second storage capacity.

19 Claims, 3 Drawing Sheets

| Temperature (℃)<br>Internal resistance(mΩ) | 5 | 10 | 20 | 30 | 40 | 50 |
|---|---|---|---|---|---|---|
| 2.80 | 1.01 | 1.03 | 1.03 | 1.03 | 1.03 | 1.01 |
| 3.70 | 1.04 | 1.07 | 1.07 | 1.07 | 1.07 | 1.04 |
| 4.60 | 1.10 | 1.15 | 1.15 | 1.15 | 1.15 | 1.10 |
| 5.50 | 1.16 | 1.20 | 1.20 | 1.20 | 1.20 | 1.16 |

METHOD AND DEVICE FOR ESTIMATING STATE OF CHARGE OF BATTERY

CROSS-REFERENCE TO RELATED APPLICATION

The present application claims priority to Korean Patent Application No. 10-2019-0166762 filed on Dec. 13, 2019, the entire contents of which is incorporated herein for all purposes by this reference.

BACKGROUND OF THE INVENTION

Field of the Invention

The present invention relates to an apparatus of estimating a state of charge (SOC) value of a battery, and more particularly, to a method and a device configured for estimating a state of charge (SOC) value of a battery configured for estimating the state of charge (SOC) value of the battery based on an internal resistance of the battery.

Description of Related Art

In recent years, interest in environmental issues, particularly global warming and climate change, has increased, and a plurality of countries have been discussing to implement climate change agreements on reducing carbon dioxide exhaust emissions. A cause of the global warming is an increase in carbon dioxide generation, and the increase in carbon dioxide generation is due to an exhaust gas exhausted from a vehicle.

It has been demanded that a fossil fuel-based vehicle increase fuel efficiency and reduce carbon exhaust in accordance with a carbon exhaust regulatory policy. Accordingly, a vehicle using environment-friendly energy to replace fossil fuels has recently been developed.

The vehicle using environment-friendly energy is a hybrid electric vehicle using both fossil fuels and electricity and an electric vehicle using only electricity.

The electric vehicle refers to a vehicle that receives electrical energy from the outside, charges the electrical energy into a battery, and travels by driving a drive motor coupled with a driving wheel using a voltage charged in the battery.

Since the electric vehicle is driven by energy charged in the battery, it is very important to determine a remaining capacity charged in the battery which is a state of charge (SOC) value of the battery. Several technologies are being developed to inform a driver of the vehicle of a distance that the vehicle can travel based on the state of charge (SOC) value of the battery.

In a conventional case, the SOC value of the battery was estimated through an open circuit voltage (OCV) map, but the SOC value of the battery could not be accurately estimated due to aging of the battery.

The information included in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing a method and a device configured for estimating a state of charge (SOC) value of a battery configured for estimating the state of charge (SOC) value of the battery of a vehicle based on an internal resistance of the battery.

Furthermore, various aspects of the present invention provide are directed to providing the method and the device configured for estimating the SOC value of the battery configured for estimating the SOC value of the battery based on the internal resistance and a charging efficiency of the battery.

Various exemplary embodiments of the present invention may provide the method for estimating the state of charge of the battery, including: determining, by a controller, whether an entry condition for estimating the SOC value of the battery is satisfied based on state data of the battery; generating, by the controller, an initial SOC value of the battery using an internal resistance value of the battery when the state data satisfies the entry condition; generating, by the controller, a first storage capacity of the battery to generate using the initial SOC value; generating, by the controller, a second storage capacity of the battery using the first storage capacity and a charging efficiency of the battery; and estimating, by the controller, the SOC value of the battery using the second storage capacity.

The determining whether the entry condition is satisfied based on the state data of the battery may include: determining, by the controller, whether a temperature of the battery included in the state data is within a reference temperature range; and determining, by the controller, whether a driving time of a vehicle including the battery is greater than or equal to a reference time when the temperature of the battery is within the reference temperature range.

The generating of the initial SOC value of the battery may include: generating, by the controller, a first SOC value of the battery according to a voltage of the battery when the state data satisfies the entry condition; generating, by the controller, a second SOC value of the battery according to the internal resistance value of the battery and a temperature of the battery; and generating, by the controller, the initial SOC value of the battery using the first SOC value and the second SOC value.

The generating of the second SOC value may include: checking, by the controller, a SOC map including a SOC value matched with each of a plurality of temperatures and internal resistance values of the battery; and generating, by the controller, the second SOC value of the battery according to the internal resistance value of the battery and the temperature of the battery using the SOC map.

The generating of the initial SOC value of the battery may include: generating, by the controller, the initial SOC value of the battery by adding the first SOC value and the second SOC value.

The generating of the first storage capacity of the battery may include: generating, by the controller, the first storage capacity using the initial SOC value and a design capacity of the battery.

The generating of the first storage capacity of the battery may include: generating, by the controller, the first storage capacity by multiplying the initial SOC value of the battery by a design capacity of the battery.

The generating of the second storage capacity of the battery may include: generating, by the controller, the charging efficiency of the battery using the internal resistance value; and generating, by the controller, the second storage capacity using the first storage capacity, a charging amount of the battery, the charging efficiency, and a discharge amount of the battery.

The second storage capacity of the battery may be generated by the equation $$PC2 = PC1 + \left|\frac{CC}{CF}\right| - |DC|.$$

In the equation, the PC2 may be the second storage capacity, the PC1 may be the first storage capacity, the CC may be a charging amount of the battery, the CF may be the charging efficiency of the battery, and the DC may be a discharging amount of the battery.

The estimating of the SOC value of the battery may include: estimating, by the controller, the SOC value of the battery using the second storage capacity and a design capacity of the battery.

The estimating of the SOC value of the battery may include: estimating, by the controller, the SOC value of the battery by dividing the second storage capacity by a design capacity of the battery.

Various exemplary embodiments of the present invention may provide the device configured for estimating the state of charge of the battery, including: a state detector configured to detect state data of the battery for controlling the battery; a resistance detector configured to detect an internal resistance value of the battery; and a controller connected to the state detector and the resistance detector and configured to determine whether an entry condition for estimating the SOC value of the battery is satisfied based on the state data. The controller may be configured to generate an initial SOC value of the battery using the internal resistance value of the battery when the state data satisfies the entry condition, generate a first storage capacity of the battery to generate using the initial SOC value, generate a second storage capacity of the battery using the first storage capacity and a charging efficiency of the battery, and estimate the SOC value of the battery using the second storage capacity.

The controller may be configured to determine that the entry condition is satisfied when a temperature of the battery included in the state data is within a reference temperature range and a driving time of a vehicle including the battery is greater than or equal to a reference time period.

The controller may be configured to generate a first SOC value of the battery according to a voltage of the battery, generate a second SOC value of the battery according to the internal resistance value of the battery and a temperature of the battery, and generate the initial SOC value of the battery using the first SOC value and the second SOC value.

The controller may be configured to generate the first storage capacity using the initial SOC value and a design capacity of the battery.

The controller may be configured to generate the charging efficiency of the battery using the internal resistance value and to generate the second storage capacity using the first storage capacity, a charging amount of the battery, the charging efficiency, and a discharge amount of the battery.

The controller may be configured to estimate the SOC value of the battery using the second storage capacity and a design capacity of the battery.

The method and the device configured for estimating the SOC value of the battery according to the exemplary embodiment of the present invention may estimate the SOC value of the battery based on the internal resistance of the battery. Thus, estimation accuracy of the battery may be improved.

Furthermore, the exemplary embodiment of the present invention may increase efficiency of charging and discharging of the battery to minimize loss of electrical energy, and may accurately predict a power amount of the vehicle based on the SOC value of the battery.

In addition to the aforementioned advantageous effect, an effect which may be obtained or anticipated by applying various exemplary embodiments of the present invention will be included explicitly or implicitly in the detailed description of the exemplary embodiment of the present invention. In other words, various effects expected by applying various exemplary embodiments of the present invention will be included within the detailed description to be provided later.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 3 is an exemplary diagram showing a state of charge (SOC) map for explaining the method for estimating the SOC value of the battery according to various exemplary embodiments of the present invention.

Figure 1:
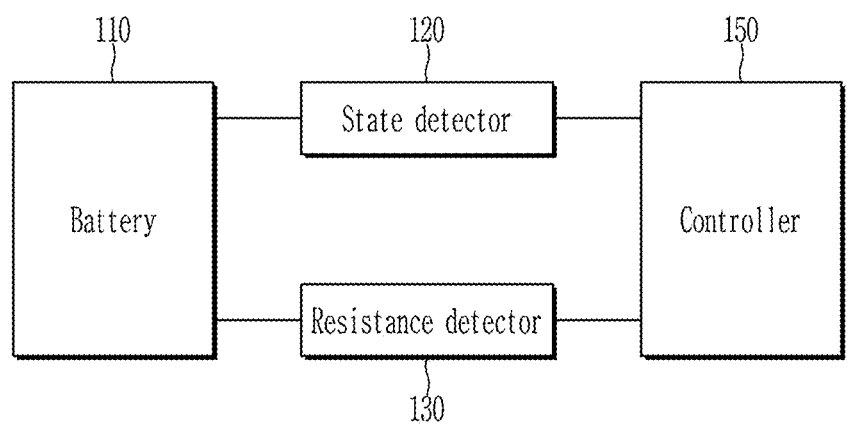
FIG. 1 is a block diagram showing a device configured for estimating a state of charge (SOC) value of a battery according to various exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, an operation principle of a method and a device configured for estimating a state of charge (SOC) value of a battery of the present invention will be described in detail with reference to the description and the accompanying drawings. However, the drawings and the detailed description relate to an exemplary embodiment among several exemplary embodiments for effectively describing features of the present invention. Therefore, the present invention is not limited only to the drawings and description.

Furthermore, in describing below exemplary embodiments of the present invention, the related well-known functions or constructions will be omitted in detail since they may unnecessarily obscure the understanding of the present invention. Furthermore, the following terminologies are defined in consideration of the functions in various exemplary embodiments of the present invention and may be construed in different ways by the intention of users and operators, practice, or the like. Therefore, the definitions thereof may be construed based on the contents throughout the specification.

Furthermore, to effectively describe core technical features of the present invention, terms may be appropriately changed, integrated, or separated for those skilled in the art in a Field of the Invention to which various exemplary embodiments of the present invention belongs to explicitly understand the present invention, but the present invention is not limited thereto.

Hereinafter, an exemplary various exemplary embodiments of the present invention will be described in detail with reference to the accompanying drawings.

FIG. 1 is a block diagram showing a device configured for estimating a state of charge (SOC) value of a battery according to various exemplary embodiments of the present invention.

Referring to FIG. 1, the device configured for estimating the SOC value of the battery of a vehicle may include a battery 110, a state detector 120, a resistance detector 130, and a controller 150.

The battery 110 may supply an electric current required for starting the vehicle or an electric current required by an electric load of the vehicle. The electric load may include a plurality of components driven by an electric current supplied from the battery 110. For example, the electric load may include an air conditioner, a radio, a navigation device, a front and rear camera, a wiper, a headlight, or a heating wire.

The battery 110 may be charged using power collected by driving a motor included in the vehicle.

The state detector 120 may detect state data of the battery 110. The state detector 120 may detect the state data including a voltage, an electric current, or a temperature of the battery 110.

The state detector 120 may detect the state data according to the control of the controller 150 or may detect the state data every predetermined time period in advance.

The state detector 120 may provide the detected state data to the controller 150.

The resistance detector 130 may detect an internal resistance or an internal resistance value of the battery 110. The resistance detector 130 may provide the detected internal resistance of the battery 110 to the controller 150.

The state detector 120 and the resistance detector 130 are referred to as separate elements, but the present invention is not limited thereto, and one element may detect the state data of the battery 110 and the internal resistance of the battery 110.

The controller 150 may estimate a state of charge (SOC) value of the battery 110 based on the state data provided from the state detector 120 and the internal resistance provided from the resistance detector 130.

The controller 150 may receive the state data from the state detector 120 and may determine whether an entry condition for estimating the SOC value of the battery is satisfied based on the state data. The controller 150 may receive the internal resistance of the battery 110 from the resistance detector 130 when the state data satisfies the entry condition.

The controller 150 may generate an initial state of charge (SOC) value of the battery 110 using the internal resistance of the battery 110. The initial SOC may represent an SOC value of the battery 110 existing when the vehicle is started.

The controller 150 may use the initial SOC to generate a first storage capacity of the battery 110. The controller 150 may generate a second storage capacity of the battery 110 using the first storage capacity and a charging efficiency of the battery.

The controller 150 may estimate a state of charge (SOC) value of the battery 110 using the second storage capacity.

The controller 150 may be implemented as at least one microprocessor operated by a program. The program may include a series of commands for executing the method of estimating the SOC value of the battery 110 according to various exemplary embodiments of the present invention described below.

The method for estimating the SOC value of the battery will be described in more detail referring to FIG. 2 and FIG. 3.

Figure 2:
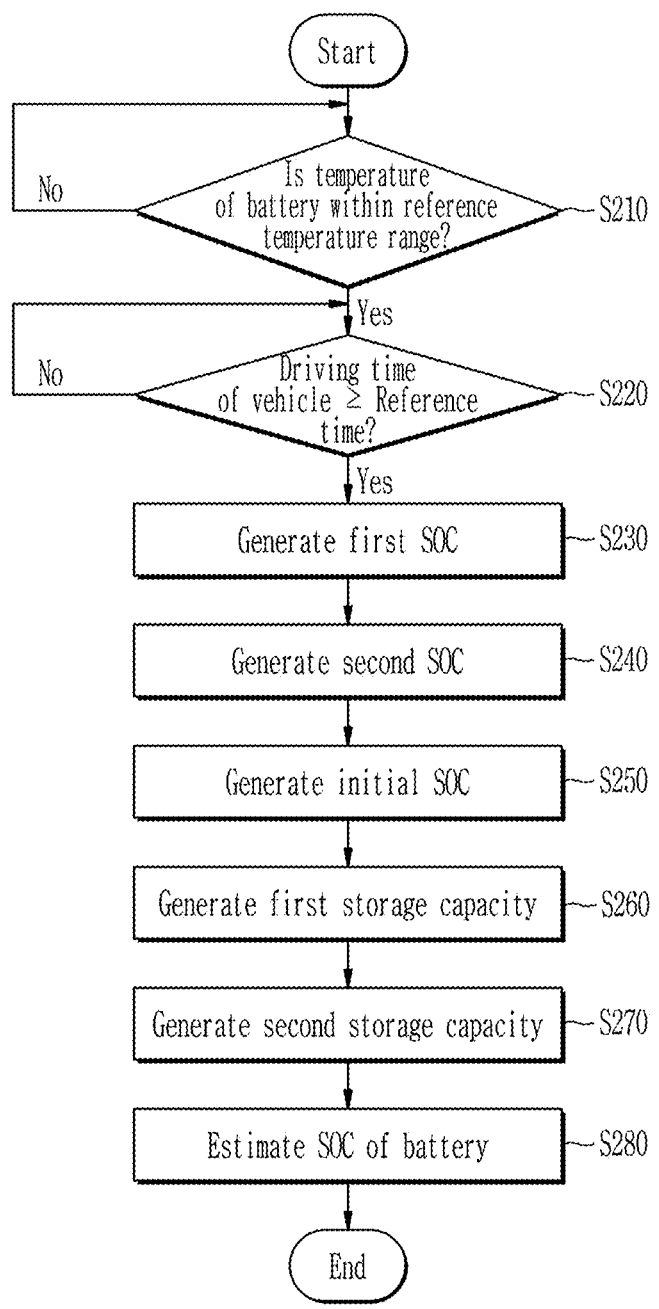
FIG. 2 is a flowchart showing a method for estimating a charging state of a battery according to various exemplary embodiments of the present invention.

FIG. 2 is a flowchart showing the method for estimating the SOC value of the battery according to various exemplary embodiments of the present invention. FIG. 3 is an exemplary diagram showing a state of charge (SOC) map for explaining the method for estimating the SOC value of the battery according to various exemplary embodiments of the present invention.

Referring to FIG. 1 and FIG. 2, the controller 150 may determine whether a temperature of the battery 110 is within a reference temperature range in step S210.

In more detail, the state detector 120 may detect the temperature of the battery 110 and may provide the detected temperature of the battery 110 to the controller 150.

The controller 150 may determine whether the temperature of the battery 110 is within the reference temperature range. The controller 150 may determine whether the temperature of the battery 110 is greater than or equal to a first reference temperature and the temperature of the battery 110 is less than or equal to a second reference temperature. The first reference temperature and the second reference temperature may represent reference temperatures for determining the SOC value of the battery 110, and may be set in advance.

When the temperature of the battery 110 does not exist within the reference temperature range, the controller 150 may again monitor the temperature of the battery to determine whether the temperature of the battery 110 exists within the reference temperature range. When the temperature of the battery 110 is less than the first reference temperature, the SOC value of the battery may not be accurately estimated due to insufficient charging due to the temperature, and when the temperature of the battery exceeds the second reference temperature, the SOC value of the battery may not be accurately estimated due to overcharging.

When the temperature of the battery 110 is within the reference temperature range, the controller 150 may determine whether a driving time of the vehicle is greater than or equal to a reference time in step S220.

In more detail, the controller 150 may check the driving time when the temperature of the battery 110 is greater than or equal to the first reference temperature and is less than or equal to the second reference temperature. The driving time may indicate a time interval during which the vehicle travels after starting of the vehicle is turned on.

The controller 150 may determine whether the driving time is greater than or equal to the reference time period. The reference time may represent a time for determining that the battery 110 is activated, and may be set in advance.

When the driving time is less than the reference time, the controller 150 may again monitor the driving time to determine whether the driving time of the vehicle is greater than or equal to the reference time period. When the driving time is less than the reference time, the battery 110 may not be activated and the internal resistance value of the battery may not be stabilized so that it is difficult to estimate the SOC the battery.

When the driving time of the vehicle is greater than or equal to the reference time, the controller 150 may generate or determine a first state of charge (SOC) value of the battery 110 using the voltage of the battery in step S230.

In more detail, the controller 150 may receive the voltage of the battery 110 from the state detector 120 when the driving time is greater than or equal to the reference time period.

The controller 150 may check an open circuit voltage (OCV) map including a state of charge (SOC) matched with each of a plurality of voltages of the battery 110. The OCV map may be preset or stored in advance. The OCV map may be a map table or a memory.

The controller 150 may generate the first SOC by extracting the SOC corresponding to the voltage of the battery 110 detected by the state detector 120 from the OCV map.

The controller 150 may generate a second SOC value (SOC) value of the battery 110 using the internal resistance value of the battery in step S240.

In more detail, the controller 150 may receive the temperature of the battery 110 from the state detector 120 and may receive the internal resistance value of the battery 110 from the resistance detector 130.

The controller 150 may check a state of charge (SOC) map including a state of charge (SOC) matched with each of a plurality of temperatures and internal resistance values of the battery 110. The SOC map may be preset or stored in advance. The SOC map may be a map table or a memory For example, the controller 150 may check the SOC map 310 shown in FIG. 3. When the temperature of the battery 110 is 20° C. and the internal resistance value of the battery is 3.70 mΩ, the controller 150 may generate the second SOC value of 1.07 through the SOC map 310.

The controller 150 may generate the initial SOC value of the battery 110 using the first SOC and the second SOC in step S250.

For example, the controller 150 may generate the initial SOC through equation 1 below.

$$SOC\_b = SOC\_1 + SOC\_2 \quad \text{[Equation 1]}$$

In the equation 1, the SOC_b may indicate the initial SOC, the SOC_1 may indicate the first SOC, and the SOC_2 may indicate the second SOC.

The controller 150 may generate the first storage capacity using the initial SOC in step S260.

In more detail, the controller 150 may check a design capacity of the battery 110. The design capacity of the battery 110 may represent a capacity of the battery initially designed.

The controller 150 may generate the first storage capacity using the initial SOC and the design capacity of the battery 110.

For example, the controller 150 may generate the first storage capacity through equation 2 below.

$$PC1 = SOC\_b * PC\_s \quad \text{[Equation 2]}$$

In the equation 2, the PC1 may indicate the first storage capacity, the SOC_b may indicate the initial SOC, and the PC_s may indicate the design capacity.

The controller 150 may generate the second storage capacity using the first storage capacity and the charging efficiency of the battery in step S270.

The state detector 120 may detect or count an electric current charged in the battery 110 and may detect or count an electric current discharged from the battery to provide the charged current and the discharged current to the controller 150.

The controller 150 may check a charging amount of the battery 110 and a discharging amount of the battery that are generated during the driving time based on the current detected by the state detector 120.

The controller 150 may generate the charging efficiency using the internal resistance value. For example, the controller 150 may generate the charging efficiency through equation 3 below.

$$CF = IR * K \quad \text{[Equation 3]}$$

In the equation 3, the CF may represent the charging efficiency, the IR may represent the internal resistance value, and the K represents a predetermined coefficient. The predetermined coefficient is a coefficient for generating the charging efficiency based on the internal resistance, and may be set through a predetermined algorithm (e.g., a program or a probability model).

The controller 150 may generate the second storage capacity using the first storage capacity, the charging amount, the charging efficiency, and the discharge amount.

For example, the controller 150 may generate the second storage capacity through the following equation 4.

$$PC2 = PC1 + \left|\frac{CC}{CF}\right| - |DC| \quad \text{[Equation 4]}$$

In the equation 4, the PC2 may represent the second storage capacity, the PC1 may represent the first storage capacity, the CC may represent the charging amount, the CF may represent the charging efficiency, and the DC may represent the discharging amount.

The controller 150 may estimate the SOC value of the battery 110 using the second storage capacity in step S280.

In more detail, the controller 150 may estimate the SOC value of the battery 110 using the second storage capacity and the design capacity of the battery.

For example, the controller 150 may generate through the following equation 5.

$$SOC\_f \frac{PC2}{PC\_s} \quad \text{[Equation 5]}$$

In the equation 5, the SOC_f may indicate the SOC value of the battery, the PC2 may indicate second storage capacity, and the PC_s may indicate the design capacity.

The controller 150 may store and manage the estimated SOC, and may provide the estimated SOC when the vehicle's element (e.g., the controller 150) requests the estimated SOC value of the battery 110.

The exemplary embodiment of the present invention may generate the initial SOC based the internal resistance value of the battery 110 and may estimate the SOC value of the battery based on the charging efficiency according to the internal resistance value and the initial SOC. Thus, the SOC value of the battery 110 may be accurately determined, and a management efficiency of the vehicle battery 110 may be increased.

Furthermore, the term "controller", "control unit" or "control device" refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present invention. The controller according to exemplary embodiments of the present invention may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors.

The controller or the control unit may be at least one microprocessor operated by a predetermined program which may include a series of commands for carrying out a method in accordance with various exemplary embodiments of the present invention.

The aforementioned invention can also be embodied as computer readable codes on a computer readable recording medium. The computer readable recording medium is any data storage device that can store data which may be thereafter read by a computer system. Examples of the computer readable recording medium include hard disk drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet).

In various exemplary embodiments of the present invention, each operation described above may be performed by a controller, and the controller may be configured by a plurality of controllers, or an integrated single controller.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A method of estimating a state of charge (SOC) value of a battery, the method comprising:
    determining, by a controller, whether an entry condition for estimating the SOC value of the battery is satisfied according to state data of the battery;
    generating, by the controller, an initial SOC value of the battery using an internal resistance value of the battery upon determining that the state data satisfies the entry condition;
    generating, by the controller, a first storage capacity of the battery to generate using the initial SOC value;
    generating, by the controller, a second storage capacity of the battery using the first storage capacity and a charging efficiency of the battery; and
    estimating, by the controller, the SOC value of the battery using the second storage capacity.

2. The method of claim 1, wherein the determining whether the entry condition is satisfied according to the state data of the battery includes:
    determining, by the controller, whether a temperature of the battery included in the state data is within a reference temperature range; and
    determining, by the controller, whether a driving time of a vehicle including the battery is greater than or equal to a reference time upon determining that the temperature of the battery is within the reference temperature range.

3. The method of claim 1, wherein the generating of the initial SOC value of the battery includes:
    generating, by the controller, a first SOC value of the battery according to a voltage of the battery upon determining that the state data satisfies the entry condition;
    generating, by the controller, a second SOC value of the battery according to the internal resistance value of the battery and a temperature of the battery; and
    generating, by the controller, the initial SOC value of the battery using the first SOC value and the second SOC value.

4. The method of claim 3, wherein the generating of the second SOC value includes:
    checking, by the controller, a SOC map including a SOC value matched with each of a plurality of temperatures and internal resistance values of the battery; and
    generating, by the controller, the second SOC value of the battery according to the internal resistance value of the battery and the temperature of the battery using the SOC map.

5. The method of claim 3, wherein the generating of the initial SOC value of the battery includes:
    generating, by the controller, the initial SOC value of the battery by adding the first SOC value and the second SOC value.

6. The method of claim 1, wherein the generating of the first storage capacity of the battery includes:
    generating, by the controller, the first storage capacity using the initial SOC value and a design capacity of the battery.

7. The method of claim 1, wherein the generating of the first storage capacity of the battery includes:
    generating, by the controller, the first storage capacity by multiplying the initial SOC value of the battery by a design capacity of the battery.

8. The method of claim 1, wherein the generating of the second storage capacity of the battery includes:
generating, by the controller, the charging efficiency of the battery using the internal resistance value; and
generating, by the controller, the second storage capacity using the first storage capacity, a charging amount of the battery, the charging efficiency, and a discharge amount of the battery.

9. The method of claim 1, wherein the second storage capacity of the battery is generated by an equation of $$PC2 = PC1 + \left|\frac{CC}{CF}\right| - |DC|,$$

wherein the PC2 is the second storage capacity, the PC1 is the first storage capacity, the CC is a charging amount of the battery, the CF is the charging efficiency of the battery, and the DC is a discharging amount of the battery.

10. The method of claim 1, wherein the estimating of the SOC value of the battery includes:
estimating, by the controller, the SOC value of the battery using the second storage capacity and a design capacity of the battery.

11. The method of claim 1, wherein the estimating of the SOC value of the battery includes:
estimating, by the controller, the SOC value of the battery by dividing the second storage capacity by a design capacity of the battery.

12. The method of claim 1, wherein the controller includes:
a processor; and
a non-transitory storage medium on which a program for performing the method of claim 1 is recorded and executed by the processor.

13. A device configured for estimating a state of charge (SOC) value of a battery, the device comprising:
a state detector configured to detect state data of the battery for controlling the battery;
a resistance detector configured to detect an internal resistance value of the battery; and
a controller connected to the state detector and the resistance detector and configured to determine whether an entry condition for estimating the SOC value of the battery is satisfied according to the state data,
wherein the controller is configured to generate an initial SOC value of the battery using the internal resistance value of the battery upon determining that the state data satisfies the entry condition, to generate a first storage capacity of the battery to generate using the initial SOC value, to generate a second storage capacity of the battery using the first storage capacity and a charging efficiency of the battery, and to estimate the SOC value of the battery using the second storage capacity.

14. The device of claim 13, wherein the controller is configured to determine that the entry condition is satisfied upon determining that a temperature of the battery included in the state data is within a reference temperature range and a driving time of a vehicle including the battery is greater than or equal to a reference time period.

15. The device of claim 13, wherein the controller is configured to generate a first SOC value of the battery according to a voltage of the battery, to generate a second SOC value of the battery according to the internal resistance value of the battery and a temperature of the battery, and to generate the initial SOC value of the battery using the first SOC value and the second SOC value.

16. The device of claim 13, wherein the controller is configured to generate the first storage capacity using the initial SOC value and a design capacity of the battery.

17. The device of claim 13, wherein the controller is configured to generate the charging efficiency of the battery using the internal resistance value and to generate the second storage capacity using the first storage capacity, a charging amount of the battery, the charging efficiency, and a discharge amount of the battery.

18. The device of claim 13, wherein the controller is configured to estimate the SOC value of the battery using the second storage capacity and a design capacity of the battery.

19. The device of claim 13, wherein the second storage capacity of the battery is generated by an equation of $$PC2 = PC1 + \left|\frac{CC}{CF}\right| - |DC|,$$

wherein the PC2 is the second storage capacity, the PC1 is the first storage capacity, the CC is a charging amount of the battery, the CF is the charging efficiency of the battery, and the DC is a discharging amount of the battery.

* * * * *